United States Patent
Malaquin et al.

(10) Patent No.: US 10,163,682 B2
(45) Date of Patent: Dec. 25, 2018

(54) METHODS OF FORMING SEMICONDUCTOR STRUCTURES

(71) Applicant: Soitec, Bernin (FR)

(72) Inventors: Cédric Malaquin, Pontcharra (FR); Ludovic Ecarnot, Vaulnaveys-le-Haut (FR); Damien Parissi, Saint-Paul-de-Varces (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/603,830

(22) Filed: May 24, 2017

(65) Prior Publication Data

US 2017/0345709 A1 Nov. 30, 2017

(30) Foreign Application Priority Data

May 25, 2016 (FR) ...................................... 16 54689

(51) Int. Cl.
| | | |
|---|---|---|
| *H01L 21/762* | (2006.01) | |
| *H01L 21/322* | (2006.01) | |
| *H01L 21/365* | (2006.01) | |
| H01L 21/265 | (2006.01) | |
| H01L 21/18 | (2006.01) | |

(52) U.S. Cl.
CPC ...... *H01L 21/76254* (2013.01); *H01L 21/187* (2013.01); *H01L 21/26506* (2013.01); *H01L 21/3226* (2013.01); *H01L 21/76251* (2013.01)

(58) Field of Classification Search
CPC ......... H01L 21/76254; H01L 21/76251; H01L 21/02032; H01L 21/02381; H01L 21/187; H01L 21/26506; H01L 21/3226
USPC ........................................................ 438/458
See application file for complete search history.

(56) References Cited

U.S. PATENT DOCUMENTS

| | | |
|---|---|---|
| 2005/0026426 A1 | 2/2005 | Maleville et al. |
| 2005/0112845 A1 | 5/2005 | Ghyselen et al. |
| 2007/0216042 A1 | 9/2007 | Delprat et al. |
| 2016/0365273 A1 | 12/2016 | Kobayashi et al. |

FOREIGN PATENT DOCUMENTS

| | | |
|---|---|---|
| EP | 1087041 A1 | 3/2001 |
| EP | 1677344 A1 | 7/2006 |
| JP | 2004-006615 A | 1/2004 |
| JP | 2005-064405 A | 3/2005 |

(Continued)

OTHER PUBLICATIONS

Taiwanese Office Action for Taiwanese Application No. 106115750 dated Sep. 29, 2017, 11 pages.

(Continued)

*Primary Examiner* — Caleen Sullivan
(74) *Attorney, Agent, or Firm* — TraskBritt

(57) ABSTRACT

The present disclosure relates to a process for the manufacture of a high resistivity semiconductor substrate, comprising the following stages: providing a first substrate with an in-depth weakened layer; providing a second substrate with a layer of an oxide at the surface; attaching the first substrate to the second substrate so as to form a compound substrate comprising a layer of buried oxide; and cleaving the compound substrate at the level of the weakened layer. The process additionally comprises at least one stage of stabilization, in particular, a stabilization heat treatment, of the second substrate with the layer of oxide before the stage of cleaving at the level of the weakened layer.

20 Claims, 2 Drawing Sheets

(56) References Cited

FOREIGN PATENT DOCUMENTS

| | | | |
|---|---|---|---|
| JP | 2006-080348 A | 3/2006 |
| JP | 2007-251129 A | 9/2007 |
| JP | 2015-177150 A | 10/2015 |
| TW | 200404924 A | 4/2004 |
| TW | 1256076 B | 6/2006 |
| TW | 201140697 A | 11/2011 |
| WO | 2003/092041 A2 | 11/2003 |
| WO | 2010/106101 A1 | 9/2010 |
| WO | 2011067394 A1 | 6/2011 |
| WO | 2016/059748 A1 | 4/2016 |

OTHER PUBLICATIONS

French Search Report for French Application No. 1654689 dated Jan. 26, 2017, 7 pages.
European Search Report and Opinion for European Application No. 17171861.2 dated Sep. 29, 2017, 7 pages.
Korean Notice of Preliminary Rejection for Korean Application No. 10-2017-0063549 dated Jun. 18, 2018, 11 pages.
Japanese Notice of Rejection for Japanese Application No. 2017-099123 dated Jun. 26, 2018, 10 pages.
Japanese Notice of Rejection for Japanese Application No. 2017-099123 dated Oct. 16, 2018, 7 pages.

METHODS OF FORMING SEMICONDUCTOR STRUCTURES

PRIORITY CLAIM

Pursuant to 35 U.S.C. § 119(a), this application claims the benefit of the filing date of French Patent Application Serial No. FR 1654689, filed May 25, 2016, for "PROCESS FOR THE MANUFACTURE OF A HIGH RESISTIVITY SEMICONDUCTOR SUBSTRATE," the disclosure of which is incorporated herein in its entirety by this reference.

TECHNICAL FIELD

The present disclosure relates to methods for the manufacture of a high resistivity semiconductor structure by layer transfer. The methods relate, in particular, to the improvement in the substrates of the silicon-on-insulator type having a high resistivity and having a high concentration of interstitial oxygen.

BACKGROUND

It is generally accepted that the use of high resistivity (or "HR") semiconductor substrates of the silicon-on-insulator ("SOI") type having a high concentration of interstitial oxygen ("High [Oi]" or "HiOi") requires the use of heat treatments targeted at stabilizing the oxygen present in the silicon (e.g., by nucleation, precipitation, etc.) in order to render the substrate highly resistive.

In this context, "high resistivity" is understood to mean approximately 750Ω·m or more and "high concentration of interstitial oxygen" is understood to mean approximately 25 ppma or more, i.e., approximately $12.5 \times 10^{17}$ atoms·cm$^{-3}$ or more.

The abovementioned stabilization stage is conventionally carried out during the stage of sacrificial oxidation of the SOI following a layer transfer carried out, for example, by the known SMART CUT® technique. Conventionally, the stabilization stage is particularly carried out after a smoothing annealing subsequent to the layer transfer, which is generally a rapid annealing, i.e., RTA ("Rapid Thermal Anneal"). U.S. Patent Application Publication 2005/0026426 A1, titled "Method for Producing a High Quality Useful Layer on a Substrate," published Feb. 3, 2005, the entire disclosure of which is incorporated by reference herein, discloses a stabilization stage subsequent to a stage of rapid annealing after the layer transfer.

On carrying out the electrical characterization of these materials (pseudo-MOS material), abnormally high interface state densities were demonstrated, typically reaching values of at least $20 \times 10^{11}$ cm$^{-2}$·eV$^{-1}$, and resulting in a poor mobility of the carriers in the SOI, typically of approximately 400 cm$^2$·V$^{-1}$·s$^{-1}$ or less for the electrons. Additional analyses (e.g., C-V characterization of an MOS capacitor) after removal of the SOI film and aluminium on a buried oxide contact have revealed fixed charge values in the buried oxide of at least $5 \times 10^{10}$ cm$^{-2}$ and crest interface state densities of at least $2 \times 10^{11}$ cm$^{-2}$·eV$^{-1}$, thus showing that the source of this poor interface quality originated from the interface under the buried oxide.

One hypothesis put forward is that the smoothing annealing (RTA-type) results in modification of the distribution of unstabilized oxygen in the substrate, thus bringing about an increase in the amount of traps under the buried oxide.

One solution for overcoming this problem lies in the use of HR substrates having a very low concentration of interstitial oxygen (i.e., "Low [Oi]"), namely, below approximately 12 ppma, i.e., below approximately $6 \times 10^{17}$ atoms·cm$^{-3}$, which does not require stabilization annealing of the oxygen in the silicon (nucleation, precipitation). This is because this type of substrate is naturally highly resistive without having to carry out a specific treatment.

However, a disadvantage of the Low [Oi] HR substrates is very high sensitivity to the propagation of dislocations during heat treatments. For this reason, it is very difficult to obtain defect-free SOIs of the sliding-plane type using such substrates.

Consequently, an improvement in the quality of the High [Oi] HR substrates remains desirable. It is thus an objective of the present disclosure to provide a process for the manufacture of a high resistivity semiconductor substrate which makes it possible, in particular, for a substrate of the silicon-on-insulator type having a high concentration of interstitial oxygen, to obtain substrates of improved quality with respect to the known state of the art.

The abovementioned objective is achieved by a process for the manufacture of a high resistivity semiconductor structure by: providing a first substrate with an in-depth weakened layer; providing a second substrate with a layer of an oxide at the surface; attaching the first substrate to the second substrate so as to form a compound substrate comprising a buried oxide layer; and cleaving the compound substrate at the level of the weakened layer. In addition, the process includes at least one stage of stabilization, in particular, a stabilization heat treatment, of the second substrate with the oxide layer before the stage of cleaving at the level of the weakened layer.

The prior art, as represented, in particular, by U.S. Patent Application Publication 2005/0026426 A1, previously incorporated by reference, teaches carrying out of a stabilization stage subsequent to a smoothing annealing stage, which is a stage occurring after cleaving the compound substrate at the level of the weakened layer. However, the prior art does not teach carrying out at least one stabilization stage before the smoothing annealing and, in particular, before the separation of the weakened layer.

Surprisingly, it has turned out that, by carrying out at least one heat treatment for stabilization of the interstitial oxygen in the silicon (e.g., nucleation, precipitation, growth of the precipitates) before the stage of cleaving at the level of the weakened layer, that is to say, before carrying out the smoothing annealing of the RTA-type, it is possible to improve the electrical (in particular, interfacial) properties of the resulting substrate, especially in the case of a high concentration of interstitial oxygen. Preferably, the at least one stabilization stage can thus be a stage of nucleation, precipitation and growth of the precipitates, in particular, a heat treatment comprising several stationary temperature phases.

BRIEF SUMMARY

The present disclosure proposes to carry out the treatments targeted at rendering a substrate having a high concentration of interstitial oxygen highly resistive (nucleation, precipitation), before any smoothing treatment of RTA-type, in particular, before the cleaving stage, during the preparation of an SOI-type substrate. The present disclosure thus makes it possible to obtain electrical characteristics compatible with the preparation of transistors of complementary metal oxide semiconductor (CMOS) type on such substrates.

Consequently, the solution provided by the present disclosure advantageously makes it possible to use substrates having a high concentration of interstitial oxygen in the preparation of an SOI substrate for applications of radio frequency (RF), photonic, imaging, digital, and the like, without having recourse to substrates having a very low concentration of interstitial oxygen, which are very sensitive to heat treatments in terms of deformations and defects induced.

In some embodiments, the weakened layer can be provided by ion implantation in the first substrate. It is thus possible to carry out the layer transfer by a technique of the SMART CUT® type.

In some embodiments, stabilization of the second substrate with the oxide layer can be carried out before attachment of the two substrates. Thus, stabilization can be carried out before the cleaving and thus before any smoothing annealing subsequent to the cleaving.

In some embodiments, the first substrate, in other words, the donor substrate in a layer transfer, may include a semiconductor material, such as silicon, germanium, or a compound of silicon and germanium. The donor substrate may include one or more alloys of semiconductors of Groups III-V and/or one or more alloys of semiconductors of Group IV of the Periodic Table.

In some embodiments, the second substrate may include silicon, in particular, having a high concentration of interstitial oxygen. Preferably, the second substrate may include silicon with a concentration of interstitial oxygen of at least approximately $12 \times 10^{17}$ atoms·cm$^{-3}$.

In some embodiments, the stabilization may include a heat treatment having several stationary phases at temperatures within a range from approximately 650° C. to approximately 1200° C.

In some embodiments, the duration of a stationary temperature phase is within a range extending from approximately 30 minutes to approximately 10 hours, such as within a range extending from approximately 1 hour to approximately 8 hours.

In some embodiments, the atmosphere of a stationary temperature phase can be of an oxidizing type (e.g., based on water and on oxygen) or of a nonoxidizing or neutral type (e.g., based on argon).

The above parameters for the stationary temperature phases yield results that make it possible to improve the electrical (e.g., interfacial) properties of the resulting substrate, especially in the case of a high concentration of interstitial oxygen.

In some embodiments, the process can additionally include at least one stage of smoothing annealing, such as rapid thermal annealing, after the stage of cleaving the compound substrate at the level of the weakened layer. It is thus possible to improve the surface roughness of the substrate after the layer transfer.

In some embodiments, the at least one stage of smoothing annealing can be carried out at a temperature within a range from approximately 1,075° C. to approximately 1,250° C., such as with a range from approximately 1,175° C. to approximately 1,230° C., such as at a temperature of approximately 1,200° C.

In some embodiments, the smoothing annealing can be carried out for a period of time within the range of approximately 15 seconds to approximately 120 seconds, such as from approximately 20 seconds to approximately 90 seconds, such as for a period of time of approximately 30 seconds.

In some embodiments, the smoothing annealing can be carried out under an atmosphere of the nonoxidizing type. For example, the atmosphere may include argon and/or hydrogen in a composition that can range from 0% to approximately 50% of hydrogen.

In some embodiments, the methods can additionally include a stage of recycling a residue of the first substrate after the stage of cleaving the compound substrate at the level of the weakened layer. It is thus possible to reuse the residue again as a donor substrate for other layer transfer processes.

BRIEF DESCRIPTION OF THE DRAWINGS

The disclosure will be explained in more detail in the following by means of advantageous embodiments and with the support of the following accompanying figures, in which.

DETAILED DESCRIPTION

In the following description of examples of embodiments of a process for the manufacture of a high resistivity semiconductor substrate, analogous reference signs can be used to denote the same elements repeated in the different embodiments. Furthermore, the description of elements already described may be omitted for the sake of conciseness.

A first example embodiment of a process for the manufacture of a high resistivity semiconductor substrate will now be described with reference to FIG. 1. In this embodiment, the transfer of a layer of a semiconductor material will be carried out from a donor substrate toward a receiver substrate.

Figure 1:
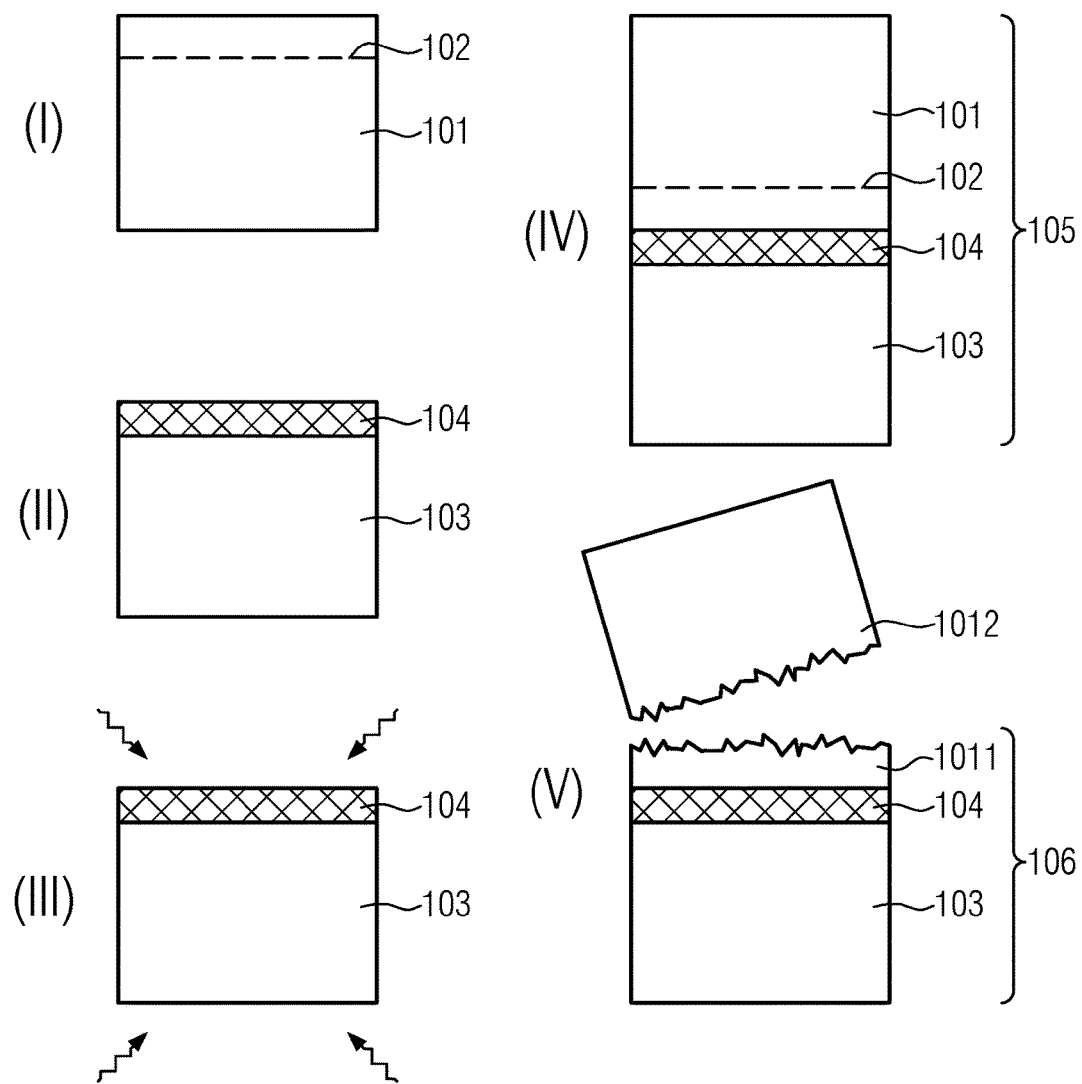
FIG. 1 diagrammatically illustrates stages of a process for the manufacture of a high resistivity semiconductor substrate according to a first example embodiment of the present disclosure.

As illustrated in Stage (I) of FIG. 1, a donor substrate 101 having an in-depth weakened layer 102 is provided for the purpose of carrying out a layer transfer toward a receiver substrate. The substrate 101 can be a semiconductor material, for example, silicon, germanium or a compound of silicon and germanium. Generally, the donor substrate 101 may include one or more alloys of semiconductors Groups III-V and/or one or more alloys of semiconductors of Group IV.

As illustrated in Stage (II) of FIG. 1, a substrate 103 having an oxide layer 104 at the surface is provided for the purpose of receiving a transferred semiconductor layer. The substrate 103 may include silicon and, in particular, interstitial oxygen with a concentration of at least approximately $12 \times 10^{17}$ atoms·cm$^{-3}$. The oxide layer 104 may be a layer of a natural oxide or a layer of $SiO_2$ obtained by growth or otherwise deposited. The layer 104 may also be, for example, an insulator used in a semiconductor of an alumina ($Al_2O_3$) type or of a nitride type (e.g., $Si_3N_4$).

As illustrated in Stage (III) of FIG. 1, before the transfer of a layer from the donor substrate 101 and, in particular, before being attached to the donor substrate 101, the substrate 103 including the oxide layer 104 at the surface may be subjected to at least one stage of stabilization treatment of the interstitial oxygen. This stage can be a stage of nucleation, precipitation, and growth of the precipitates. The stabilization can be a heat treatment comprising several stationary temperature phases. This treatment, in particular, a stationary temperature phase, can be carried out under an atmosphere of an oxidizing type, in particular, based on water and on oxygen, or else under an atmosphere of a nonoxidizing type, in particular, of a neutral type, with a gas based on argon. The substrate 103 comprising the oxide layer 104 can thus be subjected to a temperature, in particular, to stationary temperature phases, within a range from approximately 650° C. to approximately 1,200° C. Furthermore, this treatment, in particular, each stationary temperature phase, can last for approximately 30 minutes to approximately 10 hours, such as from approximately 1 hour to approximately 8 hours.

Subsequently, after the stabilization treatment, as illustrated in Stage (IV) of FIG. 1, the donor substrate 101 may be attached, such as by adhesively bonding, (e.g., by molecular adhesion or any other method of adhesively bonding semiconductors) to the receiver substrate 103 via the oxide layer 104, so as to form a compound substrate 105 of the SOI type with a buried oxide layer 104.

Subsequently, after the adhesive bonding stage, as illustrated in Stage (V) of FIG. 1, a portion 1012 of the donor substrate 101 may be detached from the compound substrate 105 by cleaving at the level of the in-depth weakened layer 102 so as to leave a transferred layer 1011 of the donor substrate 101 attached to the receiver substrate 103 via the oxide layer 104, thus forming a new compound substrate 106 comprising the transferred layer 1011. It is then possible to improve the surface roughness of the transferred layer 1011 by subjecting the compound substrate 106 to one or more smoothing heat treatments, in particular, of the rapid annealing, i.e., RTA-type. Furthermore, the residue 1012 of the donor substrate 101 can be recycled to form a new donor substrate in another layer transfer process.

The compound substrates 105 and 106 may both be structures of HiOi HR SOI type, namely, of the type of high resistivity silicon-on-insulator having a high concentration of interstitial oxygen. Given that stabilization of the interstitial oxygen has been carried out before the layer transfer, in other words, before the cleaving stage, and thus before any smoothing annealing, it is possible to obtain HiOi HR SOI substrates with interface state densities of less than $5 \times 10^{11}$ cm$^{-2}$·eV$^{-1}$ and mobilities of the carriers in the SOI of greater than 700 cm$^2$·V$^{-1}$·s$^{-1}$ for the electrons. After removal of the SOI film and aluminium on a buried oxide contact, the fixed charge values in the buried oxide can then be less than $3 \times 10^{10}$ cm$^{-2}$ and the crest interface state densities can be less than $5 \times 10^{10}$ cm$^{-2}$·ev$^{-1}$.

In other words, the electrical (in particular, interfacial) properties of the compound substrates 105 and 106 are markedly improved in comparison with HiOi HR SOI substrates obtained by conventional methods, that is to say, for which the stabilization stage would have been carried out after the smoothing annealing(s).

A second example embodiment of a process for the manufacture of a high resistivity semiconductor substrate will now be described with reference to FIG. 2. The second embodiment repeats all the characteristics of the first embodiment and, in addition, gives details of optional process stages.

Figure 2:
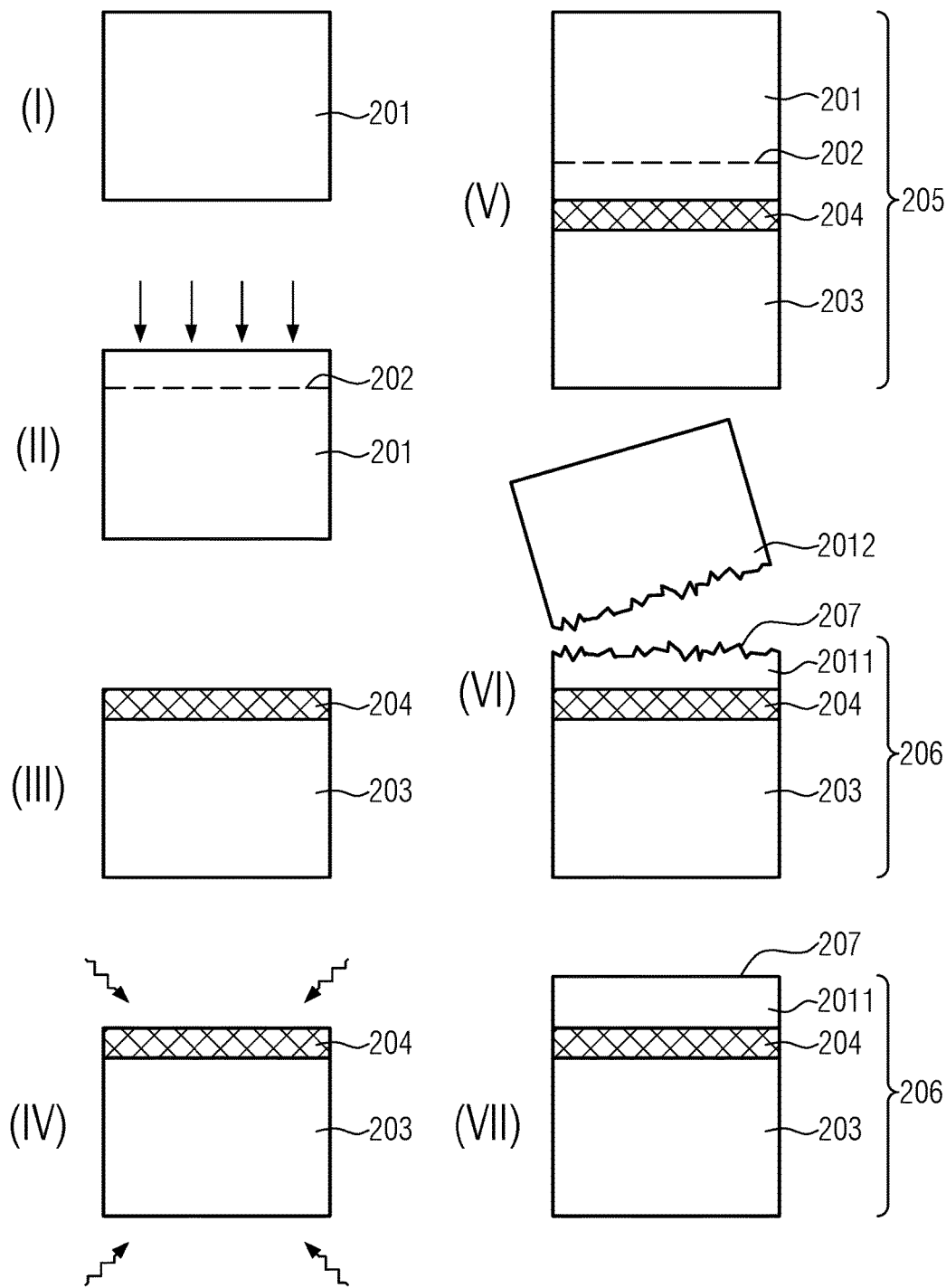
FIG. 2 diagrammatically illustrates stages of a process for the manufacture of a high resistivity semiconductor substrate according to a second example embodiment of the present disclosure.

As illustrated in Stage (I) of FIG. 2, a donor substrate 201 is provided, which can be the same as the donor substrate 101 of the first embodiment, as depicted in FIG. 1. The substrate 201 can thus also be a semiconductor material, such as silicon, germanium or a compound of silicon and germanium. Generally, the donor substrate 201 may include one or more alloys of semiconductors of Groups III-V and/or one or more alloys of semiconductors of Group IV.

Stage (II) of FIG. 2 illustrates that the donor substrate 201 can subsequently be subjected to a stage of in-depth weakening in order to provide an in-depth weakened layer 202 for the purpose of carrying out a layer transfer toward a receiver substrate, as in the first embodiment. This stage can be carried out, in particular, by ion implantation, especially by implantation of ionic entities, such as H$^+$ and/or He$^+$.

As illustrated in Stage (III) of FIG. 2, a substrate 203 having a layer of oxide 204 at the surface is also provided for the purpose of receiving a transferred semiconductor layer. Like the substrate 103 of the first embodiment (FIG. 1), the substrate 203 of the second embodiment can include silicon and, in particular, interstitial oxygen with a concentration of at least approximately $12 \times 10^{17}$ atoms·cm$^{-3}$. Still analogous to the first embodiment, the layer of oxide 204 may be a layer of a natural oxide, a layer of SiO$_2$, obtained by growth or else deposited, or also an insulator used in semiconductors of an alumina (Al$_2$O$_3$) type or of a nitride type (e.g., Si$_3$N$_4$).

As illustrated in Stage (IV) of FIG. 2, before the transfer of a layer from the donor substrate 201 and, in particular, before being attached to the donor substrate 201, the substrate 203 having the layer of oxide 204 at the surface may be subjected to at least one stage of a stabilization treatment of the interstitial oxygen. Analogous to the first embodiment, the stabilization treatment can be a stage of nucleation, precipitation, and growth of the precipitates. It can thus be a heat treatment comprising several stationary temperature phases. This treatment, in particular, a stationary temperature phase, can be carried out under an atmosphere of an oxidizing type, in particular, based on water and on oxygen, or else under an atmosphere of a nonoxidizing type, in particular, of a neutral type, with a gas based on argon. The substrate 203 having the layer of oxide 204 can thus also be subjected to a temperature, in particular, to stationary temperature phases, within a range from approximately 650° C. to approximately 1,200° C. Furthermore, this treatment, in particular, each stationary temperature phase, can last from approximately 30 minutes to approximately 10 hours, such as from approximately 1 hour to approximately 8 hours.

After stabilization, as illustrated in Stage (V) of FIG. 2, analogous to the adhesive bonding stage of the first embodiment, the donor substrate 201 and the receiver substrate 203 may be adhesively bonded at the level of the layer of oxide 204 to form a compound substrate 205 of the SOI type with the layer of buried oxide 204. In this instance also, the adhesive bonding can be carried out by molecular adhesion or any other method for the adhesive bonding of semiconductor layers.

Subsequently, as illustrated in Stage (VI) of FIG. 2, adhesive bonding may be followed by cleaving, in which a portion 2012 of the donor substrate 201 is detached from the compound substrate 205 by cleaving at the level of the in-depth weakened layer 202. This cleaving may leave a transferred layer 2011 of the donor substrate 201 attached to the receiver substrate 203 by the layer of oxide 204, thus forming a new compound substrate 206 that includes the transferred layer 2011. Such cleaving can be carried out by subjecting the compound substrate 205 to a temperature in a range from approximately 300° C. to approximately 600° C. for a period of time of approximately 30 minutes to approximately 5 hours, under a neutral atmosphere of N$_2$ or of Ar.

Subsequently, after the cleaving stage, Stage (VII) of FIG. 2 illustrates an optional subsequent smoothing stage which makes it possible to improve the roughness of the exposed surface 207 of the transferred layer 2011. This stage can be carried out by heat treatment including one or more annealings, such as rapid annealings, i.e., RTAs. The compound substrate 206 can then be exposed to a temperature within a range from approximately 1,075° C. to approximately 1,250° C., such as from approximately 1,175° C. to approximately 1,230° C., such as a temperature of approximately 1,200° C. The temperature may be maintained for a period of time from approximately 15 seconds to approximately 120 seconds, such as from approximately 20 seconds to approximately 90 seconds, such as for a period of time of approximately 30 seconds. The compound substrate 206 may be maintained under an atmosphere of the nonoxidizing type, such as an atmosphere of argon and/or hydrogen in a composition that can range from 0% to approximately 50% of hydrogen.

Finally, as mentioned above, the residue 2012 of the donor substrate 201 may be recycled in order to form a new donor substrate in another layer transfer process.

Thus, analogously to the first embodiment, it is possible in the second embodiment to obtain compound substrates 205 and 206 of HiOi HR SOI type, namely, of the type of high resistivity silicon-on-insulator having a high concentration of interstitial oxygen. In particular, given that stabilization of the interstitial oxygen was performed before the layer transfer, in other words, before the cleaving stage, and thus before any smoothing annealing, just as in the first embodiment, it is possible in the second embodiment to obtain HiOi HR SOI substrates with interface state densities of less than $5\times10^{11}$ $cm^{-2} \cdot eV^{-1}$ and mobilities of the carriers in the SOI of greater than 700 $cm^2 \cdot V^{-1} \cdot s^{-1}$ for the electrons. After removal of the SOI film and aluminium on a buried oxide contact, the fixed charge values in the buried oxide can then be less than $3\times10^{10}$ $cm^{-2}$ and the crest interface state densities can be less than $5\times10^{10}$ $cm^{-2} \cdot eV^{-1}$.

In other words, just like those of the compound substrates 105 and 106, the electrical properties (in particular, interfacial properties) of the compound substrates 205 and 206 are also markedly improved in comparison with HiOi HR SOI substrates obtained by conventional methods, that is to say, for which the stabilization stage would have been carried out after the smoothing annealing(s).

Additional non limiting example embodiments of the disclosure are described below.

Embodiment 1

A method of forming a semiconductor structure, the method comprising attaching a first substrate to a second substrate to form a compound substrate comprising a buried oxide layer stabilizing at least the second substrate; and after stabilizing at least the second substrate, cleaving the compound substrate at the weakened layer to form a semiconductor structure. The first substrate comprises a weakened layer, and the second substrate comprises a layer of an oxide.

Embodiment 2

The method of Embodiment 1, wherein stabilizing at least the second substrate comprises stabilizing at least the second substrate before attaching the first substrate to the second substrate.

Embodiment 3

The method of Embodiment 1 or Embodiment 2, wherein stabilizing at least the second substrate comprises nucleation, precipitation of precipitates, and growth of the precipitates.

Embodiment 4

The method of any one of Embodiments 1 through 3, wherein stabilizing at least the second substrate comprises heat treating the second substrate.

Embodiment 5

The method of Embodiment 4, wherein stabilizing at least the second substrate comprises heat treating at least the second substrate at each of a plurality of temperatures within a range from approximately 650° C. to approximately 1,200° C.

Embodiment 6

The method of Embodiment 5, wherein each of the plurality of temperatures is maintained for a duration with a range extending from approximately 30 minutes to approximately 10 hours.

Embodiment 7

The method of Embodiment 6, wherein each of the plurality of temperatures is maintained for a duration with a range extending from approximately 1 hour to approximately 8 hours.

Embodiment 8

The method of any one of Embodiments 4 through 7, wherein heat treating at least the second substrate comprises exposing at least the second substrate to a nonoxidizing atmosphere.

Embodiment 9

The method of Embodiment 8, wherein exposing at least the second substrate to a nonoxidizing atmosphere comprises exposing at least the second substrate to an atmosphere comprising water and oxygen.

Embodiment 10

The method of any one of Embodiments 4 through 7, wherein heat treating at least the second substrate comprises exposing at least the second substrate to an oxidizing atmosphere.

Embodiment 11

The method of Embodiment 10, wherein exposing at least the second substrate to an oxidizing atmosphere comprises exposing at least the second substrate to an atmosphere comprising argon.

Embodiment 12

The method of any one of Embodiments 1 through 11, further comprising forming the weakened layer by ion implantation in the first substrate.

Embodiment 13

The method of any one of Embodiments 1 through 12, further comprising annealing the semiconductor substrate after cleaving the compound substrate at the weakened layer.

Embodiment 14

The method of Embodiment 13, wherein annealing comprises rapid thermal annealing.

Embodiment 15

The method of Embodiment 13 or Embodiment 14, wherein annealing the semiconductor structure comprises exposing the semiconductor structure to a temperature within a range from approximately 1,075° C. to approximately 1,250° C.

Embodiment 16

The method of Embodiment 15, wherein annealing the semiconductor structure comprises exposing the semiconductor structure to a temperature within a range from approximately 1,175° C. to approximately 1,230° C.

Embodiment 17

The method of Embodiment 16, wherein annealing semiconductor structure comprises exposing the semiconductor structure to a temperature of approximately 1,200° C.

Embodiment 18

The method of any one of Embodiments 13 through 17, wherein annealing the semiconductor structure comprises exposing the semiconductor structure to an annealing condition for a period of time within a range from approximately 15 seconds to approximately 120 seconds.

Embodiment 19

The method of Embodiment 18, wherein annealing the semiconductor structure comprises exposing the semiconductor structure to an annealing condition for a period of time within a range from approximately 20 seconds to approximately 90 seconds.

Embodiment 20

The method of Embodiment 19, wherein annealing the semiconductor structure comprises exposing the semiconductor structure to an annealing condition for approximately 30 seconds.

Embodiment 21

The method of any one of Embodiments 13 through 20, wherein annealing the semiconductor structure comprises exposing the semiconductor structure to a nonoxidizing atmosphere.

Embodiment 22

The method of Embodiment 21, wherein exposing the semiconductor structure to a nonoxidizing atmosphere comprises exposing the semiconductor structure to an atmosphere comprising at least one gas selected from the group consisting of hydrogen and argon.

Embodiment 23

The method of Embodiment 22, wherein exposing the semiconductor structure to a nonoxidizing atmosphere comprises exposing the semiconductor structure to an atmosphere comprising approximately 50% hydrogen or less.

Embodiment 24

The method of any one of Embodiments 1 through 23, further comprising attaching a residue of the first substrate to a third substrate after cleaving the compound substrate at the weakened layer, the third substrate comprising a layer of an oxide.

Embodiment 25

The method of Embodiment any one of Embodiments 1 through 24, wherein the first substrate comprises a semiconductor material.

Embodiment 26

The method of Embodiment 25, wherein the semiconductor material comprises at least one element selected from the group consisting of the elements of Groups III-V of the Periodic Table.

Embodiment 27

The method of Embodiment 26, wherein the semiconductor material comprises at least one alloy comprising at least one element of Group IV of the Periodic Table.

Embodiment 28

The method of Embodiment 27, wherein the semiconductor material comprises at least one material selected from the group consisting of silicon, germanium, and compounds comprising silicon and germanium.

Embodiment 29

The method of Embodiment 26, wherein the semiconductor material comprises at least one alloy comprising at least one element of Group III of the Periodic Table and at least one element of Group V of the Periodic Table.

Embodiment 30

The method of any one of Embodiments 1 through 29, wherein the second substrate comprises silicon.

Embodiment 31

The method of Embodiment 30, wherein the second substrate comprises silicon exhibiting a concentration of interstitial oxygen of at least approximately $12 \times 10^{17}$ atoms·cm$^{-3}$.

While the present invention has been described herein with respect to certain illustrated embodiments, those of ordinary skill in the art will recognize and appreciate that it is not so limited. Rather, many additions, deletions, and modifications to the illustrated embodiments may be made without departing from the scope of the invention as hereinafter claimed, including legal equivalents thereof. In addition, features from one embodiment may be combined with features of another embodiment while still being encompassed within the scope of the invention as contemplated by the inventors. Further, embodiments of the disclosure have utility with different and various semiconductor structure types and configurations.

What is claimed is:

1. A method of forming a semiconductor structure, the method comprising:
providing a first substrate with an in-depth weakened layer;
providing a second substrate with an oxide layer at a surface thereof;
attaching the first substrate to the second substrate to form a compound substrate comprising a buried oxide layer, the first substrate comprising the in-depth weakened layer, the second substrate comprising the oxide layer;
stabilizing at least the second substrate with the oxide layer at the surface; and
after stabilizing at least the second substrate, cleaving the compound substrate at the weakened layer to form a semiconductor structure.

2. The method of claim 1, wherein stabilizing at least the second substrate comprises stabilizing at least the second substrate before attaching the first substrate to the second substrate.

3. The method of claim 1, wherein stabilizing at least the second substrate comprises nucleation, precipitation of precipitates, and growth of the precipitates.

4. The method of claim 1, wherein stabilizing at least the second substrate comprises heat treating at least the second substrate at each of a plurality of temperatures within a range from approximately 650° C. to approximately 1,200° C.

5. The method of claim 4, wherein each of the plurality of temperatures is maintained for a duration with a range extending from approximately 30 minutes to approximately 10 hours.

6. The method of claim 4, wherein heat treating at least the second substrate comprises exposing at least the second substrate to a nonoxidizing atmosphere.

7. The method of claim 4, wherein heat treating at least the second substrate comprises exposing at least the second substrate to an oxidizing atmosphere.

8. The method of claim 7, wherein exposing at least the second substrate to an oxidizing atmosphere comprises exposing at least the second substrate to an atmosphere comprising water and oxygen.

9. The method of claim 1, further comprising forming the weakened layer by ion implantation in the first substrate.

10. The method of claim 1, further comprising annealing the semiconductor substrate after cleaving the compound substrate at the weakened layer.

11. The method of claim 10, wherein annealing the semiconductor structure comprises exposing the semiconductor structure to a temperature within a range from approximately 1,075° C. to approximately 1,250° C.

12. The method of claim 11, wherein annealing the semiconductor structure comprises exposing the semiconductor structure to a temperature within a range from approximately 1,175° C. to approximately 1,230° C.

13. The method of claim 10, wherein annealing the semiconductor structure comprises exposing the semiconductor structure to an annealing condition for a period of time within a range from approximately 15 seconds to approximately 120 seconds.

14. The method of claim 13, wherein annealing the semiconductor structure comprises exposing the semiconductor structure to an annealing condition for a period of time within a range from approximately 20 seconds to approximately 90 seconds.

15. The method of claim 10, wherein annealing the semiconductor structure comprises exposing the semiconductor structure to a nonoxidizing atmosphere.

16. The method of claim 15, wherein exposing the semiconductor structure to a nonoxidizing atmosphere comprises exposing the semiconductor structure to an atmosphere comprising at least one gas selected from the group consisting of hydrogen and argon.

17. The method of claim 16, wherein exposing the semiconductor structure to a nonoxidizing atmosphere comprises exposing the semiconductor structure to an atmosphere comprising approximately 50% hydrogen or less.

18. The method of claim 1, further comprising attaching a residue of the first substrate to a third substrate after cleaving the compound substrate at the weakened layer, the third substrate comprising a layer of an oxide.

19. The method of claim 1, wherein the first substrate comprises a semiconductor material.

20. The method of claim 1, wherein the second substrate comprises silicon.

* * * * *